United States Patent [19]

Onishi et al.

[11] Patent Number: 5,279,921

[45] Date of Patent: Jan. 18, 1994

[54] PATTERN FORMATION RESIST AND PATTERN FORMATION METHOD

[75] Inventors: Yasunobu Onishi, Yokohama; Yoshihito Kobayashi, Kawasaki; Hirokazu Niki, Yokohama, all of Japan

[73] Assignee: Kabushiki Kaisha Toshiba, Kawasaki, Japan

[21] Appl. No.: 799,320

[22] Filed: Nov. 27, 1991

[30] Foreign Application Priority Data

Nov. 29, 1990 [JP] Japan .................................. 2-333040

[51] Int. Cl.$^5$ ............................................... G03C 1/73
[52] U.S. Cl. ..................... 430/270; 430/272; 430/326; 430/921; 430/923
[58] Field of Search ............... 430/270, 285, 287, 910, 430/921, 272, 326, 923

[56] References Cited

U.S. PATENT DOCUMENTS

| | | | |
|---|---|---|---|
| 4,504,372 | 3/1985 | Kirchmayr et al. | 204/159.15 |
| 4,510,290 | 4/1985 | Kirchmayr et al. | 525/162 |
| 4,822,716 | 4/1989 | Onishi et al. | 430/192 |
| 4,889,791 | 12/1989 | Tsuchiya et al. | 430/270 |

FOREIGN PATENT DOCUMENTS

3721741A1 12/1989 Fed. Rep. of Germany .
3817012A1 1/1990 Fed. Rep. of Germany .

OTHER PUBLICATIONS

Journal of Radiation Curing, Oct. 1986, G. Berner, et al., "Latent Sulphonic Acids", pp. 10-23.

*Primary Examiner*—Marion E. McCamish
*Assistant Examiner*—Rosemary Ashton
*Attorney, Agent, or Firm*—Oblon, Spivak, McClelland, Maier & Neustadt

[57] ABSTRACT

Disclosed is a pattern formation resist which can be exposed with deep UV, has a high dry etching resistance, has a large allowance in a development manipulation using an aqueous alkali solution, and can form a fine pattern having a good sectional shape. The resist comprises an alkali-soluble polymer and a compound represented by the following formula (I) and simultaneously containing, in a single molecule, a substituent which decomposes with an acid and a group which produces an acid with deep UV:

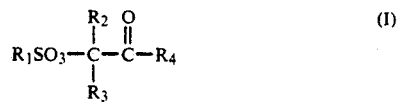

wherein the substituent which decomposes with an acid is present in at least one of $R_1$ to $R_4$, and when $R_1$ to $R_4$ have a group except for the substituent which decomposes with an acid, $R_1$ represents a nonsubstituted or substituted aliphatic hydrocarbon group, each of $R_2$ and $R_3$ independently represents a hydrogen atom or a nonsubstituted or substituted aliphatic hydrocarbon group, and $R_4$ represents a nonsubstituted or substituted aliphatic hydrocarbon group.

10 Claims, No Drawings

PATTERN FORMATION RESIST AND PATTERN FORMATION METHOD

BACKGROUND OF THE INVENTION

1. Field of the Invention

The present invention relates to a pattern formation resist and a pattern formation method using the same and, more particularly, to a pattern formation resist exposed with deep UV and a pattern formation method using the same.

2. Description of the Related Art

Pattern formation resists are widely used in the field of electronic parts, such as semiconductor integrated circuits, which require various microprocessing techniques. In particular, it is required to form fine patterns using the resists of this type because users desire multiple functions and high packing densities in electronic equipment. As an exposure apparatus for use in this pattern formation, a step-and-repeat type reduction-projecting mask aligner is known. Examples of a radiation used in this exposure apparatus are g line (wavelength 436 nm), h line (wavelength = 405 nm), and i line (wavelength = 365 nm) of a mercury lamp, and XeF (wavelength = 351 nm), XeCl (wavelength = 308 nm), KrF (wavelength = 248 nm), KrCl (wavelength = 222 nm), ArF (wavelength = 193 nm), and F2 (wavelength = 157 nm) as an excimer laser. In order to form fine patterns, the wavelength of a radiation is preferably as short as possible. For this reason, a demand has arisen for a resist which is exposed with deep UV such as an excimer laser.

Conventionally known examples of the resist for an excimer laser are a resist consisting of an acryl polymer, such as polymethylmethacrylate (PMMA) or polyglutarmaleimide (PGMI); and a resist consisting of a polymer, in which phenol is bonded in a molecule, and an azide photosensitive agent. However, the former resist is low in sensitivity with respect to an excimer laser and poor in dry etching resistance. Although the latter resist has a high sensitivity and a high dry etching resistance, the shape of a pattern formed by this resist is a reversed triangle. Therefore, it is difficult to control exposure and development steps.

Recently, U.S. Pat. Nos. 4,491,628 and 460,310, for example, disclose resists each consisting of a polymer, in which a group unstable against acids is substituted on the side chain of a resin having a dry etching resistance, and a compound which produces an acid when irradiated with an ionizing radiation. However, since the group unstable against acids is substituted on the side chain of the polymer in these resists, no stable sensitivity nor stable resolution can be obtained.

From this point of view, Published Unexamined Japanese Patent Application No. 64-35433 describes a resist containing a binder consisting of an alkali-soluble polymer, and an organic compound having a group which forms a strong acid by a radiation effect together with a group which decomposes into an acid. An onium salt is exemplified as the organic compound in Published Unexamined Japanese Patent Application No. 64-35433, and an iodonium salt and a sulfonium salt are disclosed as practical examples of the onium salt. However, since the onium salt decomposes during storage, sensitivity stability upon exposure is hindered. In addition, the onium salt largely absorbs light having a wavelength of 248 nm. Therefore, if a large amount of the onium salt is used, resolution is lowered. Consequently, it is impossible to add a sufficient amount of the onium salt, in consideration of the above relationship between the onium salt and the resolution. For this reason, the solubility of unexposed portions cannot be satisfactorily suppressed in a development step subsequent to exposure, and this makes it difficult to form fine patterns.

On the other hand, other problems arise in various exposure methods along with reduction in minimum dimensions. For example, in exposure using light, an interference occurs by reflected light components due to steps formed on a substrate (e.g., a semiconductor substrate) and largely influences dimensional precision. In electron beam exposure, on the other hand, when a resist is micropatterned, it is impossible to increase the ratio of the height to width of the pattern due to a proximity effect caused by backscattering of electrons.

As a method of solving the above problems, a multilayered resist process has been developed, and a summary of this process is described in "Solid State Technology," 74. 1981. In addition, many studies concerning this multilayered resist process have been reported. A method which is presently, most generally attempted is a three-layered structure resist process. More specifically, this three-layered structure includes a lowest layer which has functions of flattening steps on a semiconductor substrate and preventing reflection from the substrate, an interlayer which serves as an etching mask of the lowest layer, and an uppermost layer as a photosensitive layer.

The above three-layered resist process has an advantage that finer patterning can be performed than in the case of a single-layered resist process. However, according to this three-layered resist process, the number of process steps before pattern formation is undesirably increased. That is, no resist can satisfy both photosensitivity with respect to a radiation, such as deep UV, and resistance against reactive ion etching using an oxygen plasma. Therefore, these functions must be separately imparted to different layers to result in a three-layered structure. As a result, the number of process steps is increased by those required for the layer formation.

SUMMARY OF THE INVENTION

It is an object of the present invention to provide a pattern formation resist which is exposed well with a radiation having a short wavelength, such as deep UV or an ionizing radiation, has a high dry etching resistance, can be easily controlled in an exposure step and a development step using an aqueous alkali solution, and can form a fine pattern having a good sectional shape.

It is another object of the present invention to provide a pattern formation resist having high storage stability.

It is still another object of the present invention to provide a pattern formation resist which is exposed well with a radiation having a short wavelength, such as deep UV or an ionizing radiation, has a high oxygen reactive ion etching resistance (oxygen RIE resistance), can be developed with an aqueous alkali solution, and is useful in a two-layered resist process.

It is still another object of the present invention to provide a method capable of forming a fine pattern having a good sectional shape.

According to the present invention, there is provided a pattern formation resist comprising:
an alkali-soluble polymer; and a compound represented by the following formula (I) and simultaneously containing, in a single molecule, a substituent which decomposes with an acid and a group which produces an acid with a radiation.

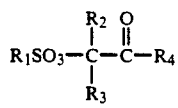

It should be noted that the substituent which decomposes with an acid is present in at least one of $R_1$ to $R_4$. When $R_1$ to $R_4$ have a group except for the substituent which decomposes with an acid, $R_1$ represents a nonsubstituted or substituted aliphatic hydrocarbon group, a nonsubstituted or substituted alicyclic hydrocarbon group, a nonsubstituted or substituted aromatic hydrocarbon group, or a nonsubstituted or substituted heterocyclic group, each of $R_2$ and $R_3$ independently represents a hydrogen atom, a nonsubstituted or substituted aliphatic hydrocarbon group, a nonsubstituted or substituted alicyclic hydrocarbon group, a nonsubstituted or substituted aromatic hydrocarbon group, or a nonsubstituted or substituted heterocyclic group, and $R_4$ represents a nonsubstituted or substituted aliphatic hydrocarbon group, a nonsubstituted or substituted alicyclic hydrocarbon group, a nonsubstituted or substituted aromatic hydrocarbon group, a nonsubstituted or substituted heterocyclic group, or an alkoxyl group. Note that $R_2$ and $R_3$ may form a cyclic hydrocarbon group or a heterocyclic group.

Examples of the alkali-soluble polymer are a acrylic acid polymer; a copolymer of acrylic acid and styrene; a methacrylic acid polymer; a copolymer of methacrylic acid and styrene; a copolymer of maleic acid and styrene; a copolymer of maleic acid monomethylester and styrene; a phenol novolak resin; a cresol novolak resin; a xylenol novolak resin; a vinylphenol resin; an isopropenylphenol resin; a copolymer of vinylphenol and, e.g., acrylic acid, a methacrylic acid derivative, acrylonitrile, or a styrene derivative; a copolymer of isopropenylphenol and, e.g., acrylic acid, a methacrylic acid derivative, acrylonitrile, or a styrene derivative; a copolymer of acrylic acid or methacrylic acid and acrylonitrile or a styrene derivative; an acrylic resin; a methacrylic resin; and a copolymer of malonic acid and vinylether. More practical examples are poly (p-vinylphenol), a copolymer (copolymerization ratio=1 : 1) of p-isopropenylphenol and acrylonitrile, a copolymer (copolymerization ratio=1 : 1) of p-isopropenylphenol and styrene, a copolymer (copolymerization ratio=1 : 1) of p-vinylphenol and methylmethacrylate, and a copolymer (copolymerization ratio=1 : 1) of p-vinylphenol and styrene.

As the above alkali-soluble polymer, one in which silicon is bonded on its main or side chain can be used. Examples of the alkali-soluble polymer are (a) polysiloxane having phenol on its side chain, (b) polysilane having phenol on its side chain, and (c) a novolak resin synthesized from phenol having silicon on its side chain. Practical examples of the polysiloxane of item (a) above are shown in Table 1 (to be presented later), and those of the polysilane of item (b) above are shown in Table 2 (to be presented later). Practical examples of the novolak resin of item (c) above are those which are obtained by condensing a silicon-bonded phenol monomer shown in Table 3 (to be presented later) and phenol with formalin or aldehyde. Examples of the phenol are phenol, o-chlorophenol, m-chlorophenol, p-chlorophenol, m-cresol, p-cresol, xylenol, bisphenol A, 4-chloro-3-cresol, dihydroxybenzene, and trihydroxybenzene.

Examples of the alkali-soluble copolymer having silicon bonded on its main or side chain are those obtained by introducing silicon into, e.g., an acrylic resin, a methacrylic resin, a copolymer of acrylic acid or methacrylic acid and acrylonitrile or a styrene derivative, and a copolymer of malonic acid and vinylether. Practical examples of such an alkali-soluble polymer are shown in Table 4 (to be presented later).

Examples of the substituent, which is introduced into at least one of $R_1$ to $R_4$ and decomposes with an acid, are ester derivatives such as methylester, ethylester, t-butylester, p-methoxybenzylester, 2,4,6-trimethylbenzylester, pentamethylbenzylester, 9-anthranylmethylester, benzohydrylester, triphenylenemethylester, phthalimidomethylester, tetrahydropyranylester, and trimethylsilylester; carbonate derivatives such as t-butoxycarbonyloxy and eenzyloxycarbonyloxy; ether derivatives such as methylether, isopropylether, t-butylether, benzylether, allylether, methoxymethylether, tetrahydropyranylether, and trimethylsilylether; and heterocyclic compounds such as a 1,3-dioxolane-4-one derivative, a 1,3-oxazoline derivative, and a 1,3-oxazine derivative.

The substituent which decomposes with an acid is preferably introduced into $R_4$ of formula (I). This substituent is preferably an ester derivative, and most preferably t-butylester.

Examples of the nonsubstituted aliphatic hydrocarbon group to be introduced to $R_1$ to $R_4$ of formula (I) are those enumerated below. Examples of the substituted aliphatic hydrocarbon group are those obtained by substituting the nonsubstituted aliphatic hydrocarbon groups enumerated in item (1) below with substituents enumerated in item (2) below.

(1) Nonsubstituted Aliphatic Hydrocarbon Groups

A methyl group, an ethyl group, a propyl group, an isopropyl group, a butyl group, an isobutyl group, a sec-butyl group, a t-butyl group, a pentyl group, a t-pentyl group, an isopentyl group, a neopentyl group, a hexyl group, an isohexyl group, a heptyl group, an octyl group, a nonyl group, a decyl group, a vinyl group, an allyl group, an isopropenyl group, a propenyl group, a methallyl group, a crotyl group, an ethynyl group, a propynyl group, a pentenyl group, a benzyl group, a trityl group, a phemotyl group, a styryl group, a cinnamyl group, and a benzhydryl group.

(2) Substituents

Di-substituted amino groups (e.g., a dimethylamino group, a diethylamino group, a dibutylamino group, a methylethylamino group, a methylbutylamino group, a diamylamino group, a dibenzylamino group, a diphenethylamino group, a diphenylamino group, a ditolylamino group, and a dixylylamino group), monosubstituted amino groups (e.g., a methylamino group, an ethylamino group, a propylamino group, an isopropylamino group, a t-butylamino group, an aninorine group, an anisidino group, a phenetidino group, a toluidino group, a xylidino group, a pyridylamino group, and a benzylideneamino group), acylamino groups (e.g., a formylamino group, an acetylamino group, a benzoylamino group, a cinnamoylamino group, a pyridinecarbonylamino group, and a trifluoroacetylamino group), tertiary amino groups (e.g., a trimethylamino group, an ethyldimethylamino group, and a dimethylphenylamino group), an amino group, a hydroxyamino group, an urido group, a semicarbazido group, di-substituted hydrazino groups (e.g., a dimethylhydrazino group, a diphenylhydrazino group, and a methylphenylhydrazino group), mono-substituted hydrazino groups (e.g., a methylhydrazino group, a phenylhydrazino group, a pyridylhydrazino group, and a benzylidenehydrazino group), a hydrazino group, azo groups (e.g., a phenylazo group, a pyridylazo group, and a thiazolylazo group), an azoxy group, an amidino group, amoyl groups (e.g., a carbamoyl group, an oxamoyl group, and a succinamoyl group), a cyano group, a cyanato group, a thiocyanato group, a nitro group, a nitroso group, oxy groups (e.g., a methoxy group, an ethoxy group, a propoxy group, a butoxy group, a hydroxyethoxy group, a phenoxy group, a naphthoxy group, a pyridyloxy group, a thiazolyloxy group, and a neacetoxy group), a hydroxy group, thio groups (e.g., a methylthio group, an ethylthio group, a phenylthio group, a pyridylthio group, and a thiazolinethio group), a mercapto group, halogen groups (e.g., a fluoro group, a bromo group, and an iodide group), a carboxy group, ester groups (e.g., a methylester group, an ethylester group, a phenylester group, and a pyridylester group), a thiocarboxy group, a dithiocarboxy group, thioester groups (e.g., a methoxycarbonyl group, a methylthiocarbonyl group, and a methylthiothiocarbonyl group), acyl groups (e.g., a formyl group, an acetyl group, a propiolnyl group, an acryloyl group, a benzoyl group, a cinnamoyl group, a pyridinecarbonyl group, and a thiazolecarbonyl group), thioacyl groups (e.g., a thioformyl group, a thioacetyl group, a thiobenzoyl group, and a thiopyridinecarbonyl group), a sulfinic acid group, sulfinyl groups (e.g., a methylsulfinyl group, an ethylsulfinyl group, and a phenylsulfinyl group), sulfonyl groups (e.g., a mesyl group, an ethylsulfonyl group, a phenylsulfonyl group, a pyridylsulfonyl group, a tosyl group, a tauryl group, a trimethylsulfonyl group, and an aminosulfonyl group), hydrocarbon groups (e.g., an alkyl group, an aryl group, an alkenyl group, and an alkinyl group), a heterocyclic group, and hydrogen silicide groups (e.g., a silyl group, a disilanyl group, and a trimethylsilyl group).

Examples of the nonsubstituted alicyclic hydrocarbon groups to be introduced to $R_1$ to $R_4$ of formula (I) are those enumerated in item (3) below. Examples of the substituted alicyclic hydrocarbon group are those obtained by substituting the nonsubstituted alicyclic hydrocarbon groups enumerated in item (3) below with the substituents enumerated in item (2) above.

(3) Nonsubstituted Alicyolic Hydrocarbon Groups

A cyclopropyl group, a cyclobutyl group, a cyclopentyl group, a cyclohexyl group, a cycloheptyl group, a cyclooctyl group, a cyclopentenyl group, a cyclohexenyl group, a cycloheptenyl group, a cyclooctenyl group, a cyclopentadienyl group, and a cyclohexadienyl group.

Examples of the nonsubstituted aromatic hydrocarbon group to be introduced to $R_1$ to $R_4$ of formula (I) are those enumerated in item (4) below. Examples of the substituted aromatic hydrocarbon group are those obtained by substituting the nonsubstituted aromatic hydrocarbon groups enumerated in item (4) below with the substituents enumerated in item (2) above.

(4) Nonsubstituted Aromatic Hydrocarbon Groups

A phenyl group, a naphthyl group, an anthryl group, a phenanthryl group, a tetralinyl group, an azulenyl group, a biphenylenyl group, an acetonaphthylenyl group, an acetonaphthenyl group, a fluorenyl group, a triphenylenyl group, a pyrenyl group, a chrysenyl group, a picenyl group, a perylenyl group, a benzopyrenyl group, a rubicenyl group, an ovalenyl group, an indenyl group, a pentalenyl group, a heptalenyl group, an indacenyl group, a phenalenyl group, a fluorantheyl group, an acephenantolylenyl group, an aceantolylenyl group, a naphthacenyl group, a pleiadenyl group, a pentaphenyl group, a pentacenyl group, a tetraphenylenyl group, a hexaphenyl group, a hexacenyl group, a trinaphelenyl group, a heptaphenyl group, a heptacenyl group, and a pyranthrenyl group.

Examples of the nonsubstituted heterocyclic group to be introduced to $R_1$ to $R_4$ of formula (I) are those enumerated in item (5) below. Examples of the substituted heterocyclic group are those obtained by substituting the nonsubstituted heterocyclic groups enumerated in item (5) below with the substituents in item (2) above.

(5) Nonsubstituted Heterocyclic Groups

A pyrrole ring group, a pyrroline ring group, a pyrrolidine ring group, an indole ring group, an isoindole ring group, an indoline group, an isoindoline ring group, an indolizine ring group, a carbazole ring group, a carboline ring group, a furan ring group, an oxolane ring group, a chroman ring group, a coumaran ring group, an isozenzofuran ring group, a phthalan ring group, a dibenzofuran ring group, a thiophene ring group, a thiolane ring group, a benzothiophene ring group, a dibenzothiophene ring group, a pyrazole ring group, a pyrazoline ring group, an indazole ring group, an imidazole ring group, an imidazoline ring group, a benzoimidazole ring group, a naphthoimidazole ring group, an oxazole ring group, an oxazoline ring group, an oxazolidine ring group, a benzoxazole ring group, a benzoxazolidine ring group, a naphthoxazole ring group, an isoxazole ring group, a benzoxazole ring group, a thiazole ring group, a thioazoline ring group, a thiazolidine ring group, a benzothiazoline ring group, a naphthothiazole ring group, an isothiazole ring group, a benzoisothiazole ring group, a triazole ring group, a benzotriazole ring group, an oxadiazole ring group, a thiadiazole ring group, a benzoxadiazole ring group, a benzothiadizole ring group, a tetrazole ring group, a purine ring group, a pyridine ring group, a pyperidine ring group, a quinoline ring group, an isoquinoline ring group, an acridine ring group, a phenanthridine ring group, a benzoquinoline ring group, a naphthoquinoline ring group, a naphthyridine ring group, a phenanthroline ring group, a pyridazine ring group, a pyrimidine ring group, a pyrazine ring group, a phthalazine ring group, a quinoxaline ring group, a quinazoline ring group, a cinnoline ring group, a phenazine ring group, a perimidine ring group, a triazine ring group, a tetrazine ring group, a pterindine ring group, an oxazine ring group, a benzoxazine ring group, a phenoxazine ring group, a thiazine ring group, a benzothiazine ring group, a phenothiazine ring group, an oxadiazine ring group, a thiadiazine ring group, a dioxolan ring group, a benzoioxole ring group, a dioxane ring group, a benzodioxane ring group, a dithiosolan ring group, a benzodithiosollur ring group, a dithiane ring group, a benzodithiane ring group, a pyrane ring group, a chromene ring group, a xanthene ring group, an oxane ring group, a chromane ring group, an isochromane ring group, a trioxane ring group, a thiolane ring group, a thian ring group, a trithian ring group, a morpholine ring group, a quinuclidine ring group, a selenazole ring group, a benzoselenazole ring group, a naphthoselenazole ring group, a tellurazole ring group, and a benzotellurazole ring group.

Practical examples of a compound represented by formula (I) will be shown in Table 5 (to be presented later).

A compound represented by formula (I) is added in an amount of preferably 1 to 300 parts by weight, and more preferably 5 to 100 parts by weight with respect to 100 parts by weight of the alkali-soluble polymer. The mixing ratio of the compound is defined for the reasons to be explained below. That is, if the mixing ratio of the compound is less than one part by weight, it is difficult to obtain a sufficient dissolution suppressing effect with respect to an aqueous alkali solution (developer), and consequently pattern formation may become difficult to perform. If, on the other hand, the mixing ratio of the compound exceeds 300 parts by weight, film properties may be degraded to make it difficult to form a resist layer having a uniform thickness.

The resist according to the present invention further contains, in addition to the alkali-soluble polymer and a compound represented by formula (I), an organic solvent for dissolving the above components. Examples of the organic solvent are ketone solvents such as cyclohexanone, acetone, methylethylketone, and methylisobutylketone; cellosolve solvents such as methylcellosolve, methylcellosolveacetate, ethylcellosolveacetate, and butylcellosolveacetate; and ester solvents such as ethyl acetate, butyl acetate, and isoamyl acetate. These solvents can be used singly or in the form of a mixture of two or more.

The resist according to the present invention can contain a surfactant as a film modifier and a dye as an antireflection agent, in addition to the alkali-soluble polymer and a compound represented by formula (I).

(1) A method of forming a pattern by a single-layered process and (2) a method of forming a pattern by a two-layered process, each using the pattern formation resist according to the present invention, will be described below.

(1) Pattern Formation Method by Single-Layered Process

First, a resist containing the alkali-soluble polymer, a compound represented by formula (I), and the organic solvent is coated on a substrate by, e.g., a spin coating method or a dipping method, and dried to form a resist layer. As the alkali-soluble polymer in the resist, one in which no silicon is bonded on its main or side chain is used. Examples of the substrate are a silicon wafer, a silicon wafer on which various insulating films, electrodes, or interconnections are formed, a blank mask, and a semiconductor wafer consisting of a Group III-V compound such as GaAs or AlGaAs.

Subsequently, deep UV or an ionizing radiation is selectively radiated on the resist layer through a mask having a desired pattern, thereby performing pattern exposure. Examples of deep UV are excimer lasers such as XeF (wavelength=351 nm), XeCl (wavelength=308 nm), KrF (wavelength=248 nm), KrCl (wavelength=222 nm), ArF (wavelength=193 nm), and $F_2$ (wavelength=157 nm); g line (wavelength=436 nm), h line (wavelength=405 nm), and i line (wavelength=365 nm) of a mercury lamp. Examples of the ionizing radiation are an electron beam, and X-rays. Note that when an electron beam is used, the pattern exposure is performed by scanning the beam. Subsequently, by developing the pattern-exposed resist layer by, e.g., a dipping method or a spraying method using an aqueous alkali solution, a desired pattern is formed. As the aqueous alkali solution, it is possible to use, for example, an aqueous organic alkali solution such as an aqueous tetramethylammoniumhydroxide solution, or an aqueous inorganic alkali solution such as potassium hydroxide or sodium hydroxide. These aqueous alkali solutions are normally used at a concentration of 15 wt. % or less. In addition, rinsing may be performed using water or the like after the development.

(2) Pattern Formation Method by Two-Layered Resist Process

First, after a polymeric material is coated on a substrate like that used in the single-layered process described above, baking is performed at 100° C. to 250° C. for 30 to 150 minutes to form a polymeric material layer (flattening layer) having a desired height. As the above polymeric material, any polymeric material can be used so long as it has purity with which no troubles are caused in the fabrication of semiconductor devices. Practical examples of the polymeric material are a positive resist consisting of substituted o-quinonediazide and a novolak resin, polystyrene, polymethylmethacrylate, polyvinylphenol, a novolak resin, polyester, polyvinylalcohol, polyethylene, polypropylene, polyimide, polybutadiene, polyvinyl acetate, and polyvinylbutyral. These resins are used singly or in the form of a mixture of two or more.

Subsequently, a resist containing the alkali-soluble polymer, a compound represented by formula (I), and the organic solvent is coated on the polymeric material layer by, e.g., a spin coating method using a spinner, a dipping method, a spraying method, or a printing method, and dried to form a resist layer. As the alkali-soluble polymer in the resist, one in which silicon is bonded on its main or side chain is used.

Next, pattern exposure is performed by selectively radiating deep UV or an ionizing radiation from the above-mentioned light source on the resist layer through a mask having a desired mask. In this exposure step, a solubility of exposed portions in an aqueous alkali solution becomes lower than that of unexposed portions. Upon exposure, either a contact exposure scheme or a projecting exposure scheme may be adopted. Subsequently, the aqueous alkali solution is used to perform development by, e.g., the dipping method or the spraying method, thus forming a desired pattern.

This pattern is used as a mask to etch away exposed portions of the flattening layer by an oxygen reactive ion etching method (oxygen RIE method). At this time, the resist which constitutes the pattern contains an alkali-soluble polymer having silicon bonded on its main or side chain. For this reason, when the pattern is exposed to the oxygen RIE, a silicon dioxide ($SiO_2$) layer or an analogous layer is formed on the surface layer of the pattern, and the result is that the pattern has a oxygen RIE resistance 10 to 100 times that of the exposed portions of the flattening layer. Consequently, since the pattern serves as a good mask in the oxygen RIE, the portions of the flattening layer exposed from the pattern are selectively removed by the oxygen RIE, and an optimal pattern profile results.

The single-layered pattern and the two-layered pattern thus obtained by the above steps of formation are used as a mask to etch the substrate or the like. As an etching means, a wet etching method or a dry etching method is employed. In order to form a fine pattern of 3 μm or less on a substrate or the like, the dry etching method is preferably adopted. When a silicon oxide film is an object to be etched, an aqueous hydrofluoric acid solution or an aqueous ammonium fluoride solution, for example, is used as a wet etchant. When aluminum is an object to be etched, it is possible to use, e.g., an aqueous phosphoric acid, an aqueous acetic acid solution, or an aqueous silver nitrate solution. When a chromium film is an object to be etched, an example of the etchant is an aqueous ammonium cerium nitrate solution. Examples of a dry etching gas are $CF_4$, $C_2F_6$, $CCl_4$, $BCl_3$, $Cl_2$, HCl, and $H_2$, and these gases can be combined together as needed. The etching conditions, e.g., the concentration of the etchant (or the concentration of the dry etching gas) in a reaction chamber, the reaction temperature, and the reaction time are determined on the basis of a combination of the type of a material, on which a fine pattern is to be formed, and the resist, but are not particularly limited by the etching method.

After the etching step, the pattern consisting of the resist, or the pattern consisting of the polymeric material and the resist, which remains on the substrate, is removed by, e.g., a stripper such as J-100 (tradename) available from NAGASE KASEI K.K., or an oxygen plasma.

In addition to the above steps, it is possible to add further steps in correspondence with an application. Examples of the additional step are a rinsing step (normally using water) for washing away a developer after development, a pretreatment step performed before coating of solutions in order to improve adhesion properties between the resist layer and the flattening layer or between the flattening layer and the substrate, a baking step performed before or after development, and an ultraviolet ray reradiation step performed before dry etching.

According to the pattern formation resist of the present invention as described above, in the selective radiation (exposure) step using deep UV or an ionizing radiation, a compound represented by formula (I) as one component of the resist produces an acid, and this acid decomposes the substituent, which decomposes with an acid, in a compound of formula (I). A mechanism of producing the acid is assumed that C=O in the above formula is excited with light, a bond of $R_1SO_3$—C is ruptured by a dislocation reaction, and the isolated $R_1SO_3$ produces an acid as $R_1SO_3H$.

A compound represented by formula (I) initially has an effect of suppressing dissolution. However, this dissolution suppressing effect vanishes upon decomposition of the substituent which decomposes with an acid, and a pattern latent image forms. This latent image is preferentially removed by dissolution in development performed after the exposure, thus forming a pattern (positive pattern).

In addition, since the alkali-soluble polymer is mixed in the resist, it is possible to perform development using an aqueous alkali solution after the exposure. Therefore, a swell of the pattern is suppressed compared with the case of development using an organic solvent.

It is, therefore, possible to form a fine positive pattern which is exposed well with deep UV or an ionizing radiation, can be easily controlled in the exposure and development steps, has a high dry etching resistance, and has a made rectangular sectional shape.

In addition, a compound represented by formula (I), which is contained in the resist, has both the portion which produces an acid and the substituent which decomposes with an acid. Therefore, the number of types of components constituting the resist can be decreased. This facilitates mixing control of the respective components for preparing the resist, improves the reproducibility of resolution, and further improves storage stability.

Furthermore, a polymer having silicon bonded on its main or side chain is used as the alkali-soluble polymer constituting the resist, and this makes it possible to form a fine pattern having a high oxygen RIE resistance by the exposure and the development using an aqueous alkali solution. Therefore, by forming the pattern on a polymeric material layer (flattening layer) and dryetching the flattening layer with an oxygen plasma using the pattern as an oxygen RIE-resistant mask, a fine two-layered pattern having a high aspect ratio and a good sectional shape can be formed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

DETAILED DESCRIPTION OF THE PREFERRED EMBODIMENTS

The present invention will be described in detail below by way of its examples.

EXAMPLE 1

70 g of poly(p-vinylphenol) and 30 g of a compound represented by formula (I), both shown in Table 6 (to be presented later), were dissolved in 250 g of ethylcellosolveacetate, and the resultant solution was filtered using a fluorine resin membrane filter having a pore size of 0.2 μm, thus preparing a resist.

The prepared resist was coated on a silicon wafer, and the wafer was dried on a hot plate at 90° C. for five minutes, thereby forming a 1.0-μm thick resist layer. The formed resist layer was subjected to pattern exposure (100 mJ/cm$^2$) by a reduction projecting exposure machine using a KrF (wavelength=248 nm) excimer laser beam. The resulting material was heated on the hot plate at 120° C. for one minute. Thereafter, the resultant material was developed by dipping in a 1.8-wt. % aqueous tetramethylammoniumhydroxide solution (to be abbreviated an aqueous TMAH solution hereinafter) for one minute, thus forming a positive pattern.

EXAMPLES 2-6

Pairs of alkali-soluble polymers and compounds represented by formula (I), mixing amounts of which are listed in Table 6 (to be presented later), were dissolved each in 250 g of ethylcellosolveacetate. The resultant solutions were filtered by a fluorine resin membrane filter having a pore size of 0.2 μm, thereby preparing five types of resists.

Subsequently, following the same procedures as in Example 1, these resists were subjected to coating drying, pattern exposure, and baking on silicon wafers. Thereafter, development was performed with a 2.38-wt. % aqueous TMAH solution, thus forming five types of positive patterns.

The shapes of the positive patterns of Examples 1 to 6 were examined. The result is also shown in Table 6 (to be presented later).

As is apparent from Table 6, fine positive patterns with a rectangular profile could be formed with high precision according to Examples 1 to 6.

In addition, a period in which a sensitivity change falls within a range of ±10% at room temperature (25° C.) was checked for each of the resists used in Examples 1 to 6. As a result, the periods of these resists were 12 months or more. That is, it was confirmed that each resist had high storage stability.

EXAMPLE 7

An aluminum film was coated on a silicon wafer, and a resist like that in Example 1 was coated on the aluminum film. Following the same procedures as in Example 1, exposure and development were performed to form a pattern 0.35 μm in width. Subsequently, portions of the aluminum film exposed from the pattern as a mask were subjected to dry etching using $CBrCl_3$ gas. Consequently, the above 0.35-μm pattern could be faithfully transferred onto the aluminum film.

EXAMPLES 8–12

Pairs of alkali-soluble polymers and compounds represented by formula (I), mixing amounts of which are shown in Table 7 (to be presented later), were dissolved each in 250 g of ethylcellosolveacetate. The resultant solutions were filtered by a fluorine resin membrane filter having a pore size of 0.2 μm, thus preparing five types of resists.

Subsequently, following the same procedures as in Example 1, these resists were subjected to coating, drying, pattern exposure, and baking on silicon wafers. Thereafter, development was performed with a 2.38-wt. % aqueous TMAH solution, thereby forming five types of positive patterns.

Controls 1 & 2

Pairs of alkali-soluble polymers and compounds each having, in a single molecule, a substituent which decomposes with an acid and a group which produces an acid with light, in mixing amounts shown in Table 8 (to be presented later), were dissolved each in 250 g of ethylcellosolveacetate. The resulting solutions were filtered by a fluorine resin membrane filter having a pore size of 0.2 μm, thus preparing two types of resists.

Subsequently, following the same procedures as in Example 1, these resists were subjected to coating, drying, pattern exposure, and baking on silicon wafers. Thereafter, development was performed with a 2.38-wt. % aqueous TMAH solution, thereby forming two types of positive patterns.

A period in which a sensitivity change falls within a range of ±10% at room temperature (25° C.) was examined for each of the resists of Examples 8 to 12 and Controls 1 and 2. In addition, the shapes of the positive patterns formed by Examples 8 to 12 and Controls 1 and 2 were checked. The results of Examples 8 to 12 are shown in Table 7 (to be presented later), and those of Controls 1 and 2 are shown in Table 8 (to be presented later).

As is apparent from Tables 7 and 8, according to Examples 8 to 2, fine positive patterns with a rectangular profile could be formed with high precision, and the storage stability of each resist was good. Conversely, Controls 1 and 2 were poor in both pattern resolution and storage stability.

EXAMPLE 13

A silicon-bonded alkali-soluble polymer and compound represented by formula (I), mixing amounts of which are shown in Table 9 (to be presented later), was dissolved in 400 g of ethylcellosolveacetate. Thereafter, the resultant solution was filtered by a fluorine resin membrane filter having a pore size of 0.2 μm, thereby preparing resist.

Subsequently, a polymeric material solution containing a commercially available novolak resin was coated on a silicon substrate to have a thickness of 2.0 μm. Thereafter, the resultant material was heated at 220° C. for 30 minutes to form a polymeric material layer (flattening layer). The above resist was coated on the flattening layer to have a thickness of 0.6 μm, and the resultant material was dried on a hot plate at 90° C. for five minutes. Pattern exposure (100 mJ/cm²) was then performed using a KrF excimer laser beam 248 nm in wavelength. The resulting material was heated on the hot plate at 100° C. for five minutes. After the heating, the resultant material was developed by dipping in a 1.0-wt. % aqueous TMAH solution for one minute to form a positive pattern (upper pattern).

The silicon substrate having the upper pattern was placed in a dry etching apparatus (HIRRIE (tradename): available from TOKUDA SEISAKUSHO K.K.). Reactive ion etching (RIE) was performed using an oxygen plasma at a power of 0.8 W/cm², an oxygen gas pressure of 4 Pa, and a flow rate of 50 sccm for two minutes, thereby selectively etching the lower flattening layer by using the upper pattern as a mask. At this time, a flattening pattern was formed on the silicon substrate.

EXAMPLES 14–18

Pairs of silicon-bonded alkali-soluble polymers and compounds represented by formula (I), mixing amounts of which are shown in Table 9 (to be presented later), were dissolved each in 400 g of ethylcellosolveacetate. Thereafter, the resultant solutions were filtered by a fluorine resin membrane filter having a pore size of 0.2 μm, thereby preparing five types of resists.

Subsequently, five types of flattening patterns were formed using these resists, respectively, in the same method as Example 13.

The shapes of the flattening patterns of Examples 13 to 18 were observed by a scanning electron microscope. The result is also shown in Table 9 (to be presented later).

As is apparent from Table 9, it was possible to form two-layered patterns each having a fine and sharp pattern profile 0.3 μm in both line width and line interval.

In addition, a period in which a sensitivity change falls within a range of ±10% at room temperature (25° C.) was checked for each of the resists used in Examples 13 to 18. As a result, these resists had periods of 12 months or more. That is, it was confirmed that each resist had high storage stability.

As has been described above, the pattern formation resist according to the present invention is exposed well with deep UV or an ionizing radiation, has a high dry etching resistance, and can suppress swell or the like because it can be developed with an aqueous alkali solution after exposure. The result is that a fine pattern having a rectangular sectional shape is formed with high precision through simple steps and control. In addition, the pattern formation resist according to the present invention has a high storage stability. This makes it possible to use the resist as a mask in a dry etching step for semiconductor devices.

Furthermore, the pattern formation resist according to the present invention, which contains as one component an alkali-soluble polymer in which silicon is bonded on its main or side chain, makes it possible to form a fine pattern having an oxygen RIE resistance by exposure using deep UV or a ionizing radiation and development using an aqueous alkali solution. Therefore, this pattern formation resist can be applied to a two-layered resist process which can be micropatterned more finely than a single-layered resist process.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

TABLE 1

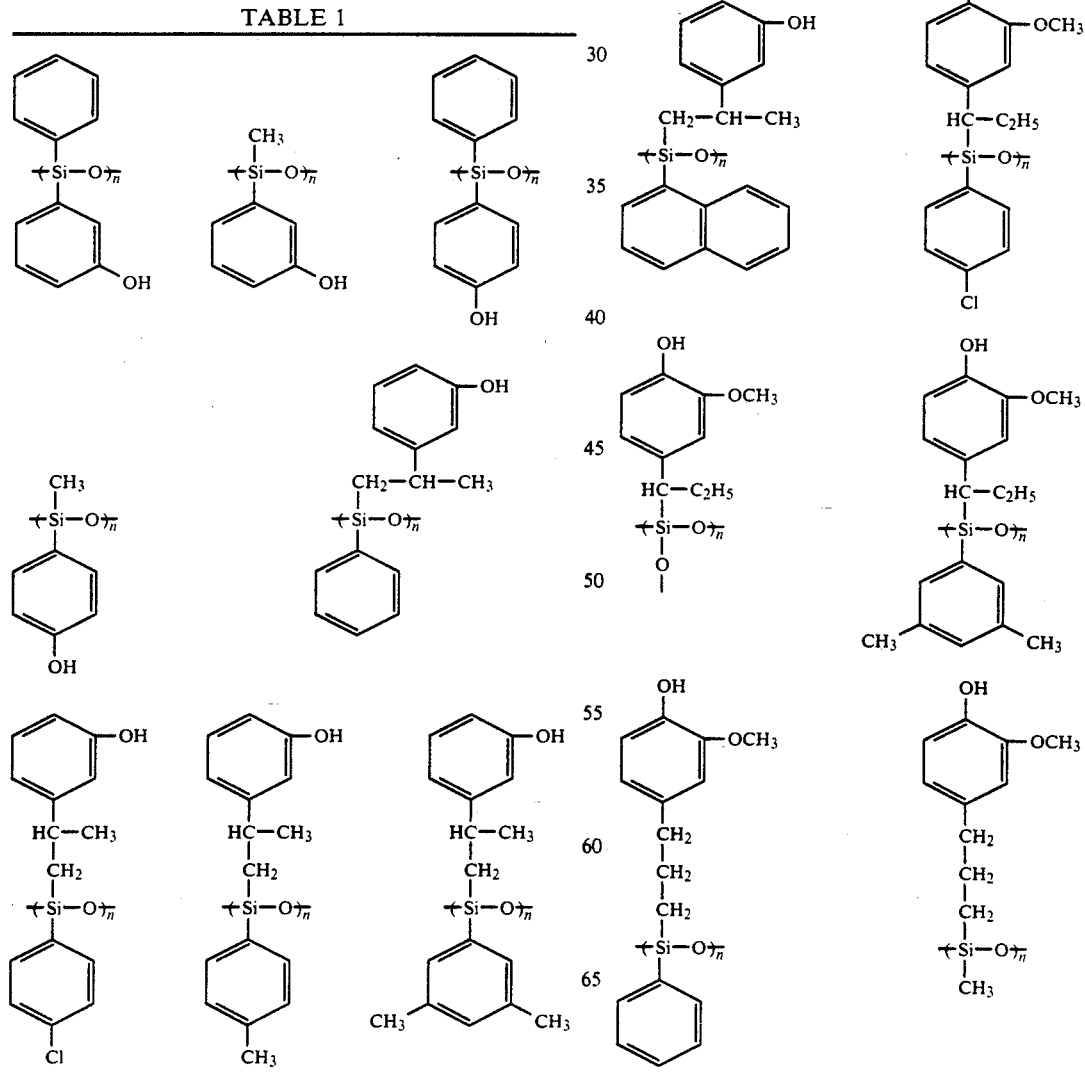

TABLE 1-continued
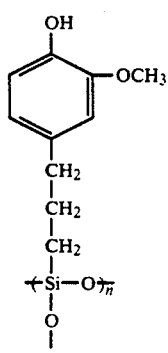 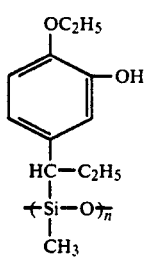
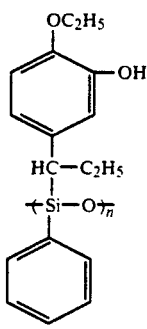
TABLE 2
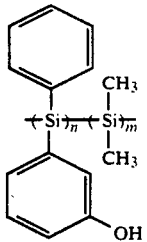 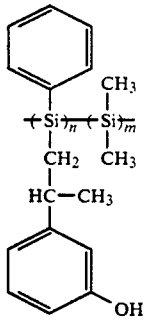
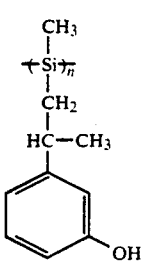 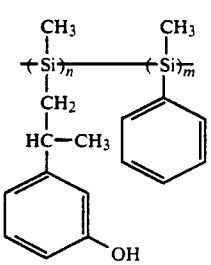
TABLE 2-continued
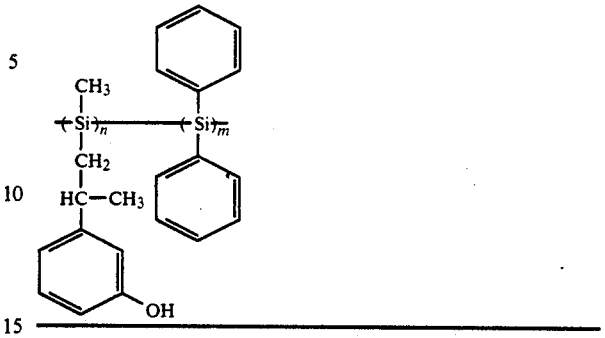
TABLE 3
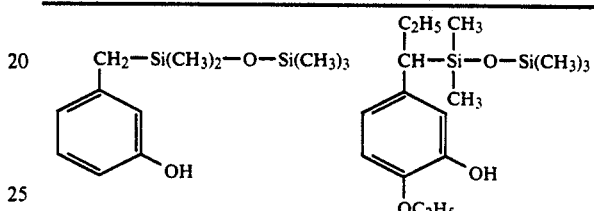
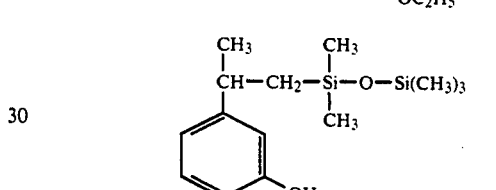
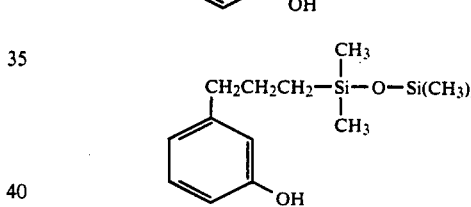
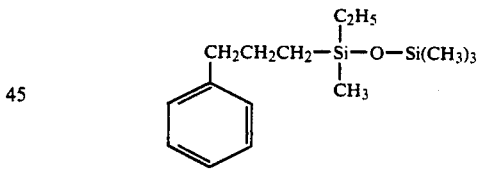
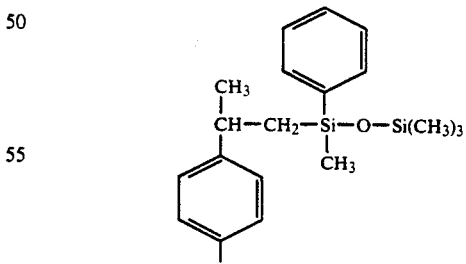
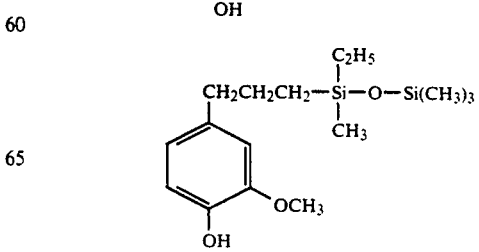

TABLE 3-continued
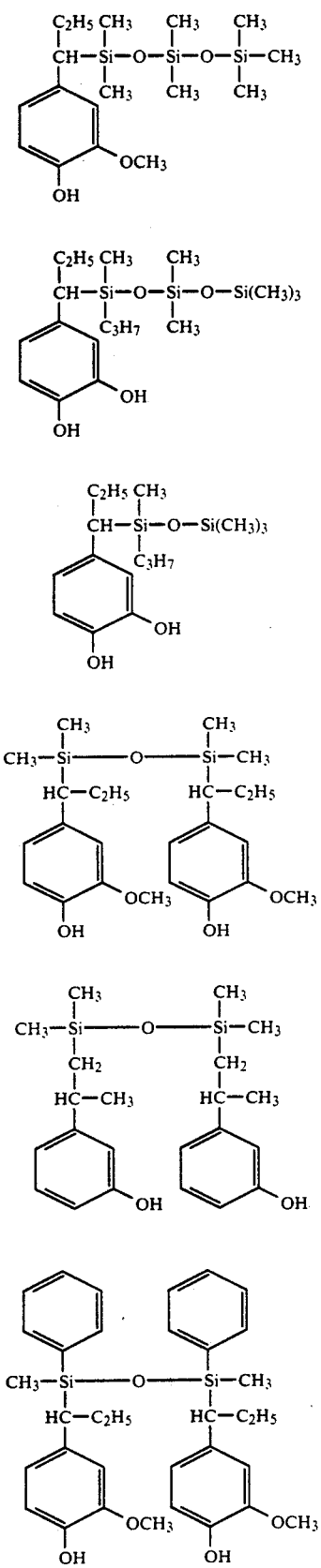
TABLE 3-continued
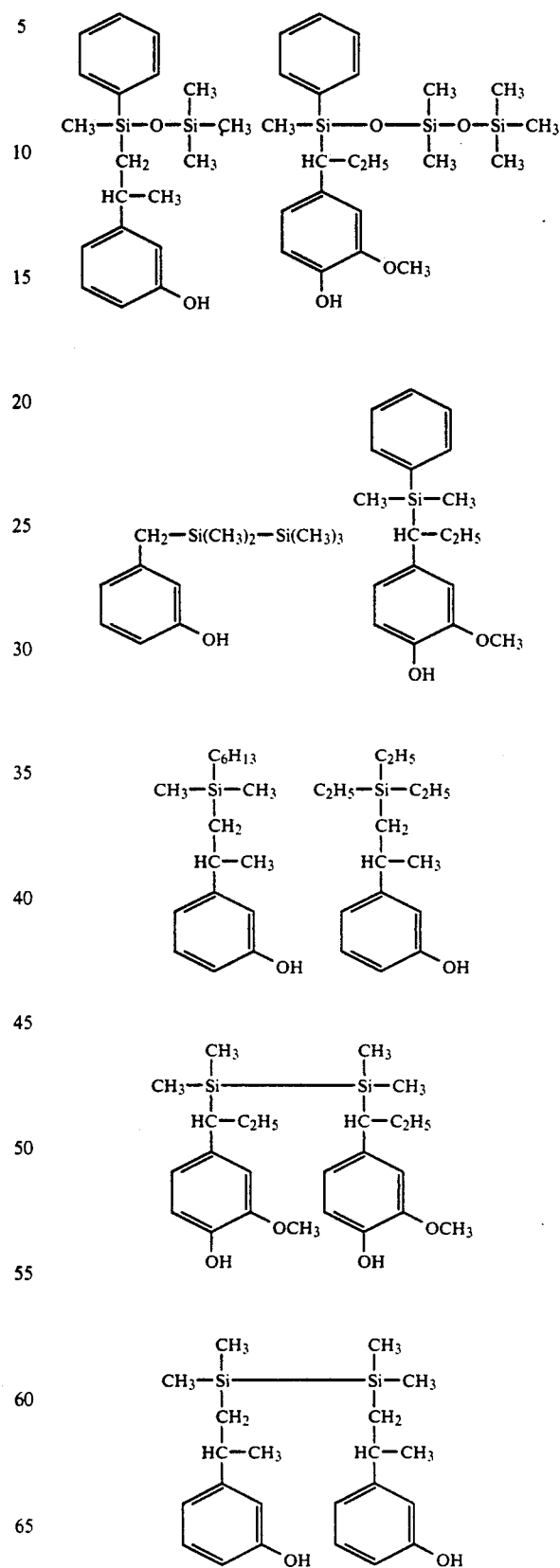

TABLE 3-continued
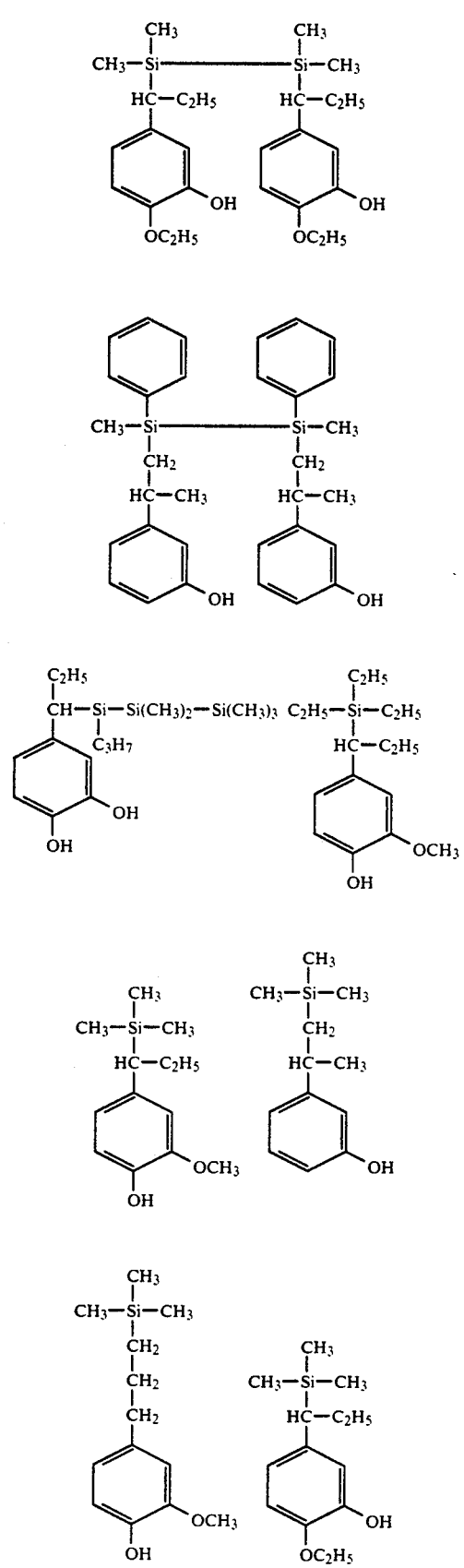
TABLE 3-continued
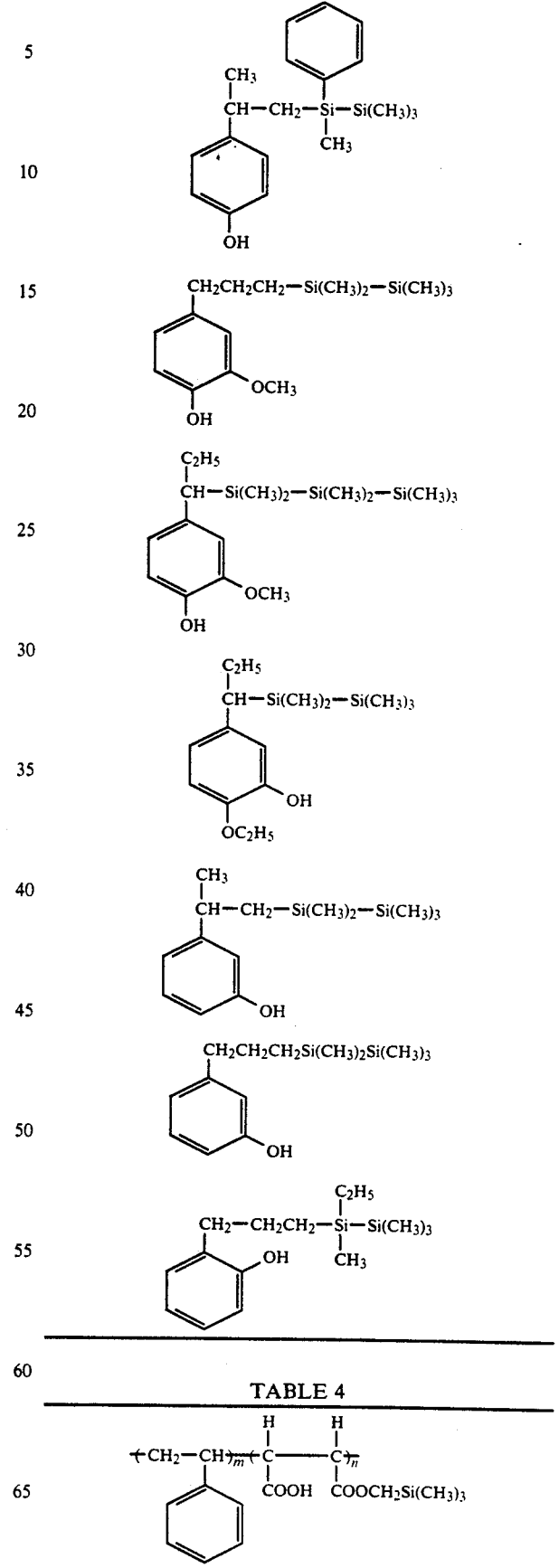
TABLE 4
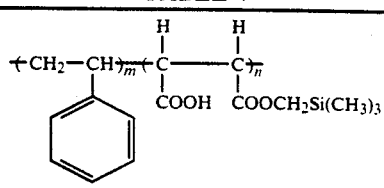

TABLE 4-continued
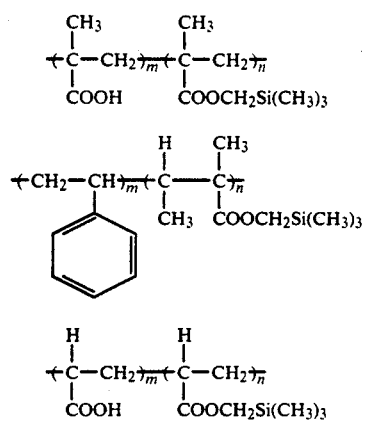
TABLE 4-continued
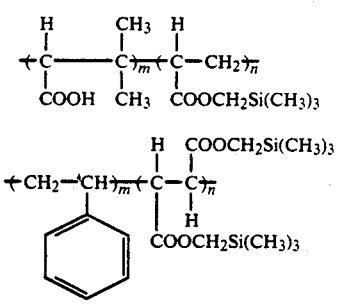
TABLE 5
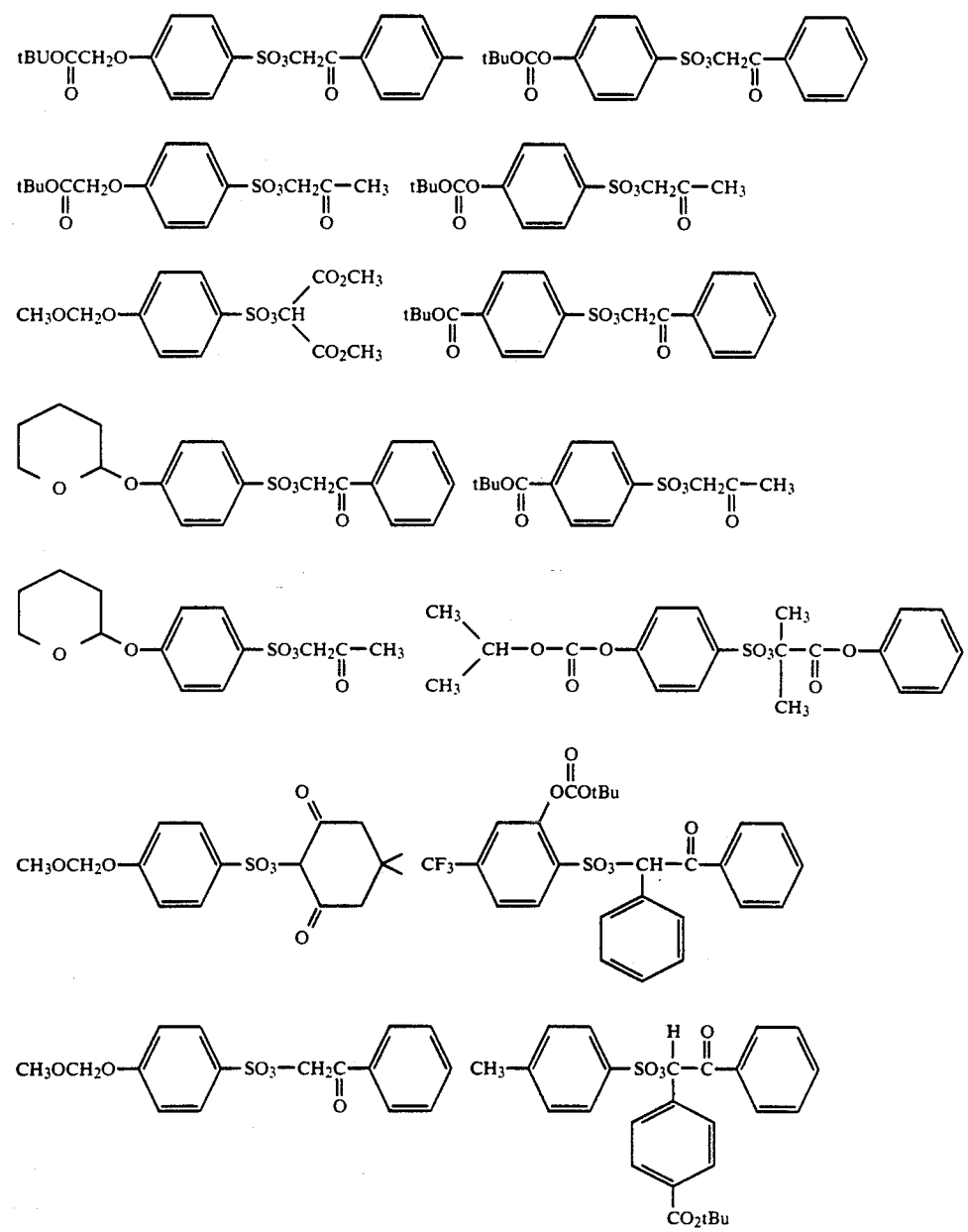

TABLE 5-continued
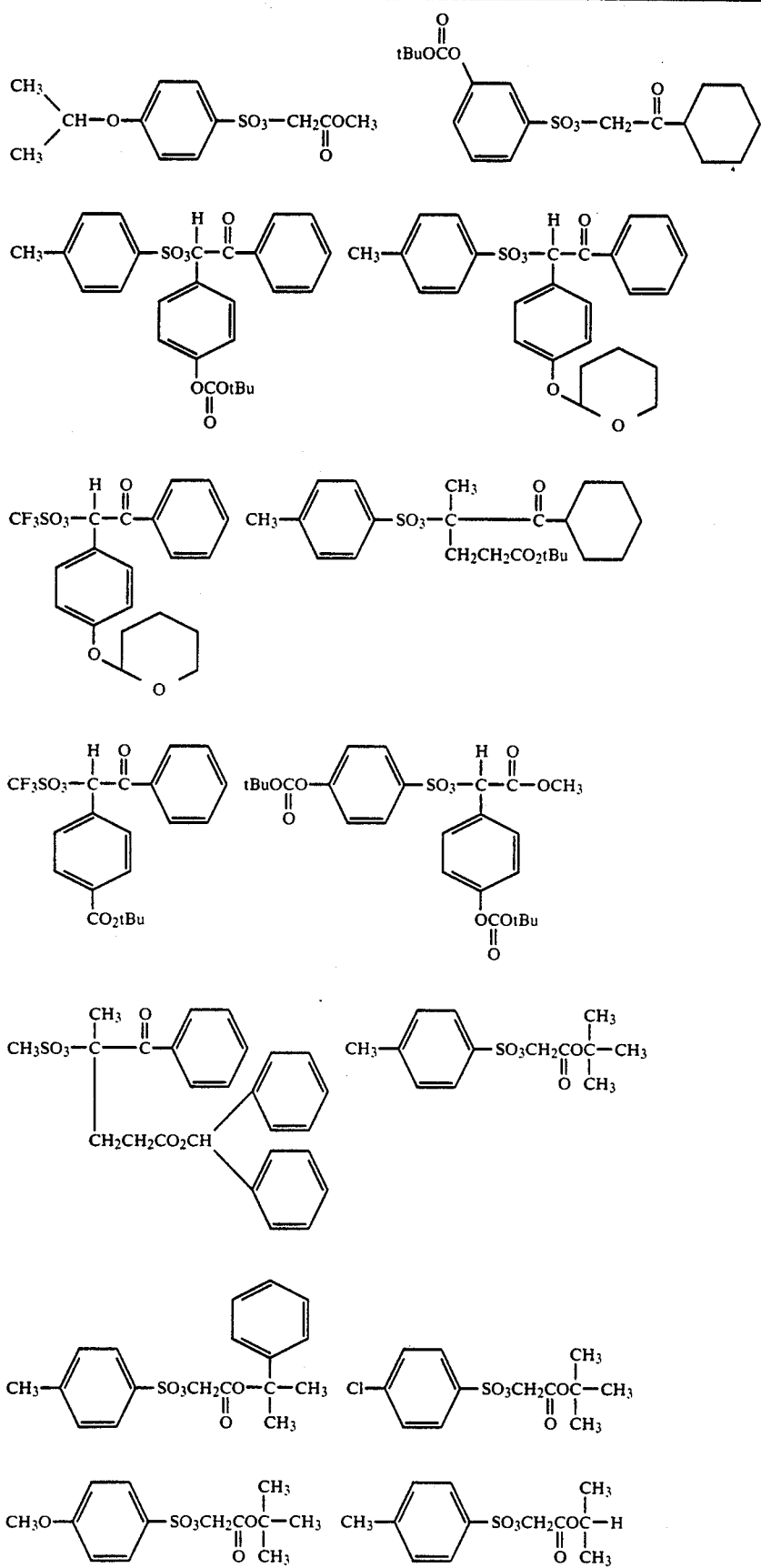

TABLE 5-continued
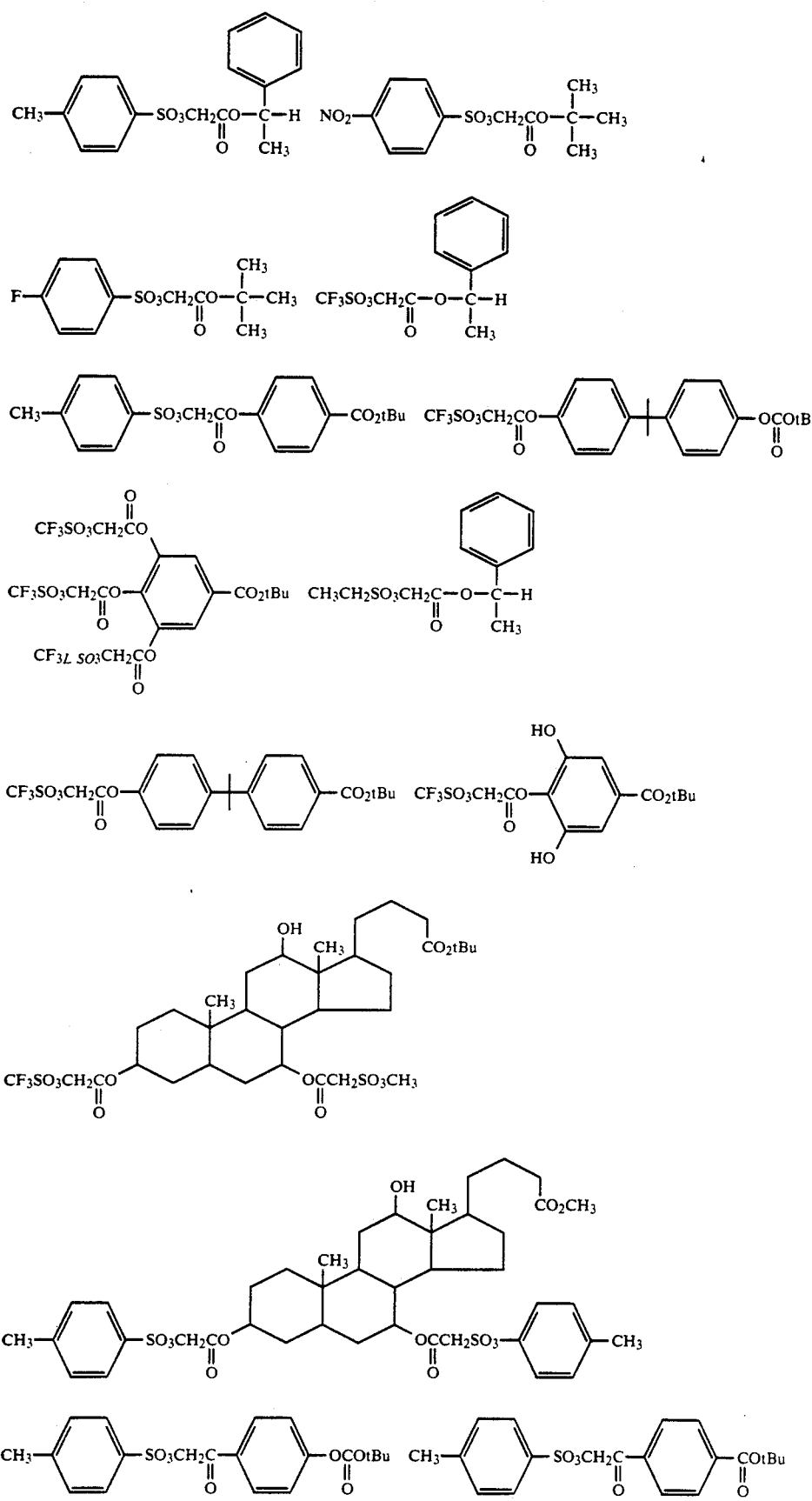

TABLE 5-continued

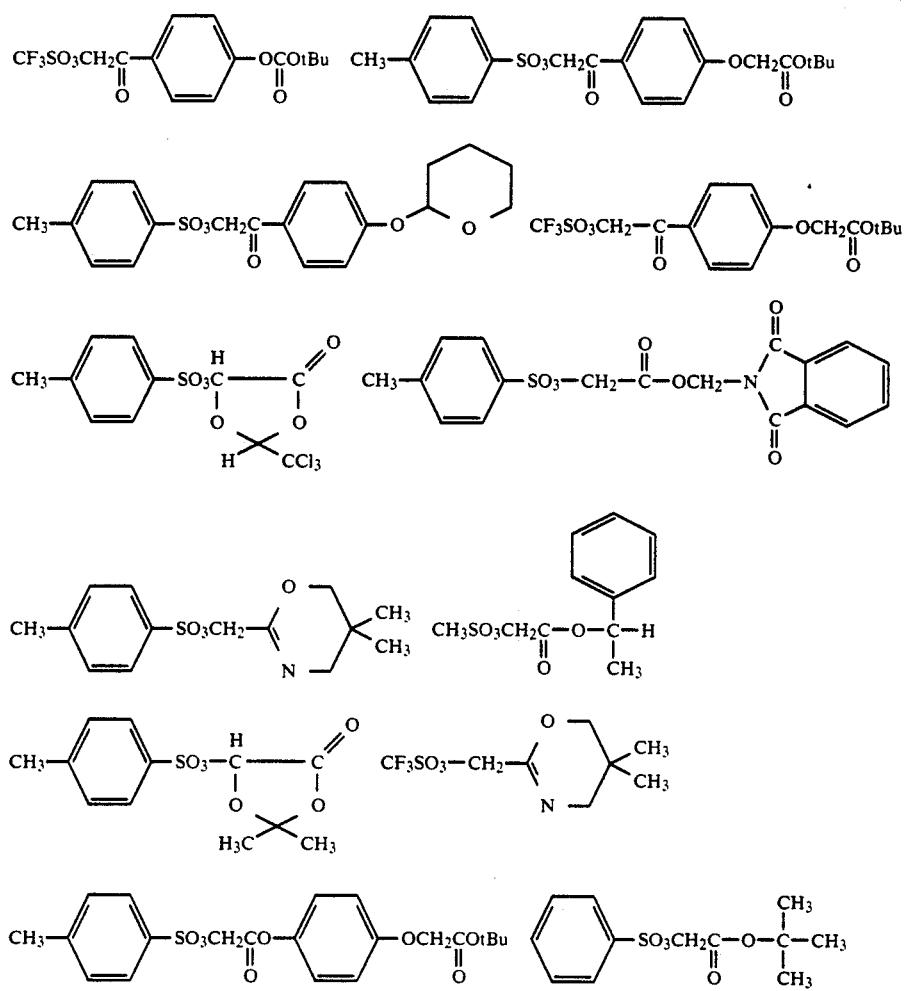

TABLE 6

| Example | Alkali-soluble polymer (numerals in parentheses represent mixing amount) | Compound represented by formula (I) (numerals in parentheses represent mixing amount) | Pattern shape |
| --- | --- | --- | --- |
| 1 | Poly(p-vinylphenol) (70 g) | CH₃—C₆H₄—SO₃CH₂CO₂tBu (30 g) | Sharp pattern profile of 0.35 μm |
| 2 | 1:1 copolymer of poly(p-vinylphenol-methy methacrylate) (70 g) | CH₃OCH₂O—C₆H₄—SO₃CH₂C(O)C₆H₅ (30 g) | Sharp pattern profile of 0.35 μm |
| 3 | 1:1 copolymer of poly(styrene-maleic acid) (70 g) | CH₃—C₆H₄—SO₃CH₂C(O)C(C₆H₅)(CH)(C₆H₅) (30 g) | Sharp pattern profile of 0.35 μm |

TABLE 6-continued

| Example | Alkali-soluble polymer (numerals in parentheses represent mixing amount) | Compound represented by formula (I) (numerals in parentheses represent mixing amount) | Pattern shape |
|---|---|---|---|
| 4 | Novolak resin (m-cresol:p-cresol = 1:1) (70 g) | 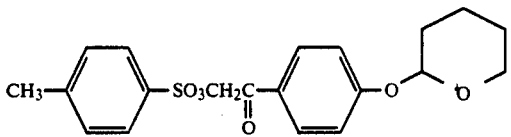 (30 g) | Sharp pattern profile of 0.35 μm |
| 5 | Poly(p-vinylphenol) (70 g) | 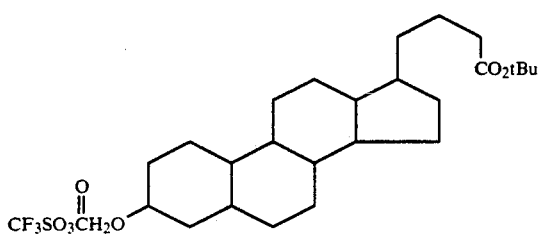 (30 g) | Sharp pattern profile of 0.35 μm |
| 6 | Poly(p-vinylphenol) (70 g) | 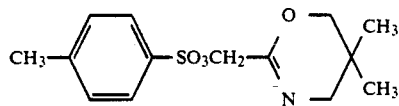 (30 g) | Sharp pattern profile of 0.35 μm |

TABLE 7

| Example | Alkali-soluble polymer (numerals in parentheses represent mixing amount) | Compound represented by formula (I) (numerals in parentheses represent mixing amount) | Period of sensitivity ± 10% | Pattern shape |
|---|---|---|---|---|
| 8 | Poly(p-vinylphenol) (50 g) | 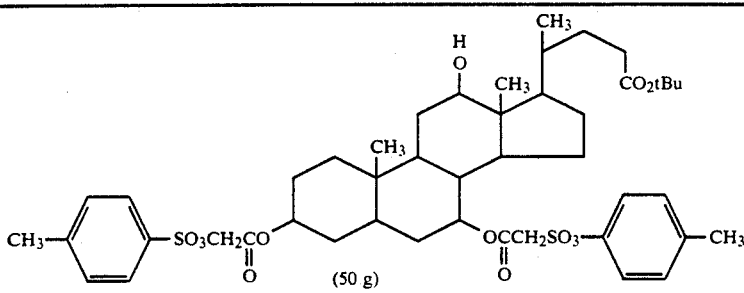 (50 g) | >12 months | Sharp pattern of 0.35 μm |
| 9 | 1:1 copolymer of (styrene-maleic acid methylester) (40 g) | 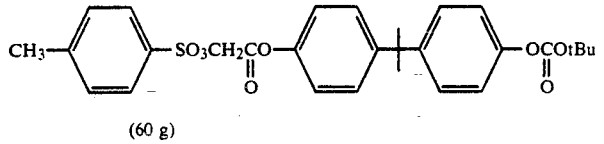 (60 g) | >12 months | Sharp pattern of 0.35 μm |
| 10 | Novolak resin (m-cresol: p-cresol = 1:1) (60 g) | 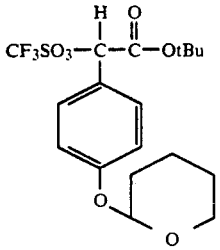 (40 g) | >12 months | Sharp pattern of 0.35 μm |

TABLE 7-continued

| Example | Alkali-soluble polymer (numerals in parentheses represent mixing amount) | Compound represented by formula (I) (numerals in parentheses represent mixing amount) | Period of sensitivity ± 10% | Pattern shape |
|---|---|---|---|---|
| 11 | Poly(p-vinyl-phenol) (50 g) | 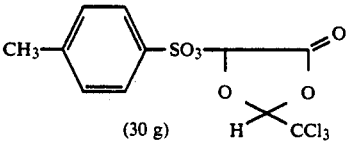 (30 g) | >12 months | Sharp pattern of 0.35 μm |
| 12 | 1:1 copolymer of poly(α-methylstyrene-maleic acid methylester) (90 g) | 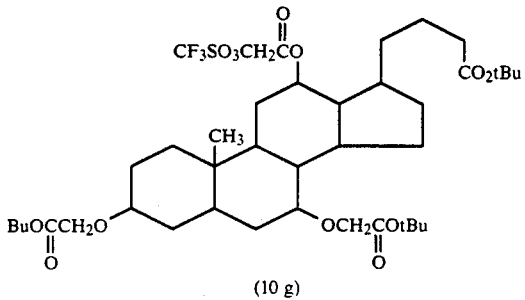 (10 g) | >12 months | Sharp pattern of 0.35 μm |

TABLE 8

| Control | Alkali-soluble polymer (numerals in parentheses represent mixing amount) | Compound having in one molecule both substituent which decomposes with acid and group which produces acid with light (numerals in parentheses represent mixing amount) | Period of sensitivity ± 10% | Pattern shape |
|---|---|---|---|---|
| 1 | Poly(p-vinylphenol) (70 g) | 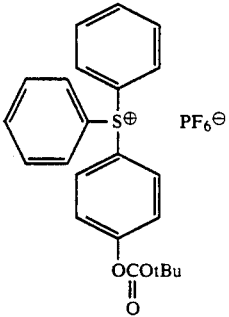 (30 g) | 3 months | Tapered pattern of 0.40 μm |
| 2 | Cresol novolak resin (90 g) | 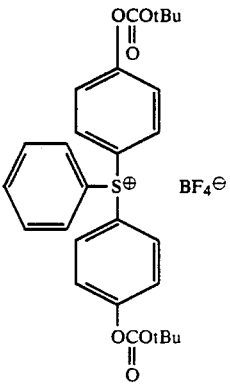 (10 g) | 4 months | Sharp pattern of 0.40 μm |

TABLE 9
| Example | Silicon-bonded alkali-soluble polymer (numerals in parenthesis represent mixing amount) | Compound represented by formula (I) (numerals in parentheses represent mixing amount) | Pattern shape |
|---|---|---|---|
| 13 | 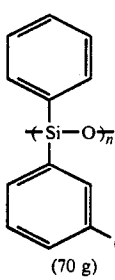 (70 g) | 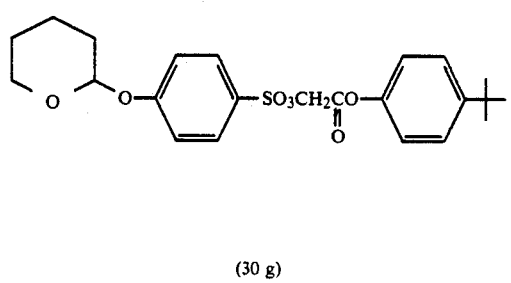 (30 g) | Sharp pattern of 0.35 μm |
| 14 | 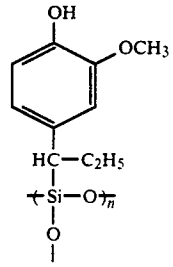 (50 g) | 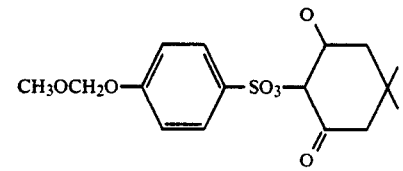 (50 g) | Sharp pattern of 0.35 μm |
| 15 | 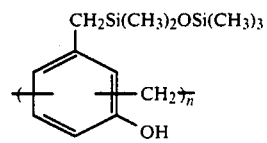 (70 g) | 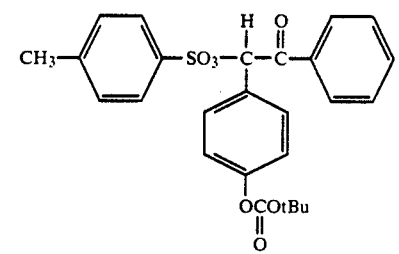 (30 g) | Sharp pattern of 0.35 μm |
| 16 | 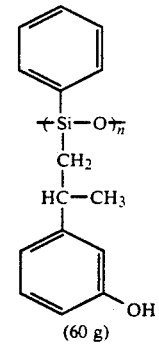 (60 g) | 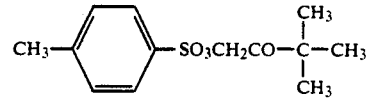 (40 g) | Sharp pattern of 0.35 μm |
| 17 | 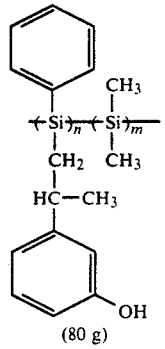 (80 g) | 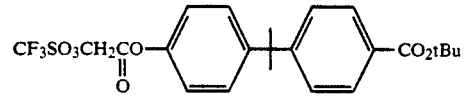 (20 g) | Sharp pattern of 0.35 μm |

TABLE 9-continued

| Example | Silicon-bonded alkali-soluble polymer (numerals in parenthesis represent mixing amount) | Compound represented by formula (I) (numerals in parentheses represent mixing amount) | Pattern shape |
| --- | --- | --- | --- |
| 18 | 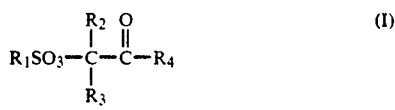 (70 g) | CH$_3$—⟨phenyl⟩—SO$_3$—C(O)(O)C(=O), with C(CH$_3$)$_2$ bridge (H$_3$C, CH$_3$) (30 g) | Sharp pattern of 0.35 μm |

What is claimed is:

1. A pattern formation resist comprising:
   an alkali-soluble polymer; and
   a compound represented by the following formula (I) and containing in said compound an acid decomposable t-butylester or a derivative thereof and a group which produces an acid upon irradiation, $$R_1SO_3-\underset{R_3}{\overset{R_2}{\underset{|}{\overset{|}{C}}}}-\overset{O}{\overset{\|}{C}}-R_4 \quad (I)$$

wherein said acid decomposable t-butylester or derivative thereof is present in at least one of $R_1$ to $R_4$, when $R_1$ to $R_4$ have a group except for said acid decomposable t-butylester or derivative thereof, $R_1$ represents a nonsubstituted or substituted aliphatic hydrocarbon group, a nonsubstituted or substituted alicyclic hydrocarbon group, a nonsubstituted or substituted aromatic hydrocarbon group, or a nonsubstituted or substituted heterocyclic group, each of $R_2$ or $R_3$ independently represents a hydrogen atom, a nonsubstituted or substituted aliphatic hydrocarbon group, a nonsubstituted or substituted alicyclic hydrocarbon group, a nonsubstituted or substituted aromatic hydrocarbon group, or a nonsubstituted or substituted heterocyclic group, and $R_4$ represents a nonsubstituted or substituted aliphatic hydrocarbon group, a nonsubstituted or substituted alicyclic hydrocarbon group, a nonsubstituted or substituted heterocyclic group, or an alkoxyl group, and $R_2$ and $R_3$ may form a cyclic hydrocarbon group or a heterocyclic group.

2. The resist according to claim 1, wherein said alkali-soluble polymer has a silicon bonded on a main or side chain thereof.

3. The resist according to claim 1, wherein said compound is mixed in an amount of 1 to 300 parts by weight with respect to 100 parts by weight of said alkali-soluble polymer.

4. The resist according to claim 1, further containing an organic solvent.

5. The resist according to claim 1, further containing a surfactant.

6. The resist according to claim 1, further containing an antireflection agent.

7. A pattern formation method comprising the steps of:
   forming a layer consisting of a resist according to claim 1 on a substrate;
   exposing said resist layer; and
   performing development using an aqueous alkali solution.

8. The method according to claim 7, wherein said substrate is a silicon wafer.

9. The method according to claim 7, wherein said exposure step comprises selectively radiating deep UV on said resist layer.

10. The method according to claim 7, wherein said aqueous alkali solution is an aqueous tetramethylammoniumhydroxide solution.

* * * * *